(12) United States Patent
Lundell

(10) Patent No.: US 7,078,967 B2
(45) Date of Patent: Jul. 18, 2006

(54) CONTROL OF BIAS VOLTAGE

(75) Inventor: Jonas Lundell, Maersta (SE)

(73) Assignee: Nokia Corporation, Espoo (FI)

( * ) Notice: Subject to any disclaimer, the term of this patent is extended or adjusted under 35 U.S.C. 154(b) by 265 days.

(21) Appl. No.: 10/169,196

(22) PCT Filed: Dec. 21, 2000

(86) PCT No.: PCT/FI00/01133

§ 371 (c)(1),
(2), (4) Date: Jun. 28, 2002

(87) PCT Pub. No.: WO01/50594

PCT Pub. Date: Jul. 12, 2001

(65) Prior Publication Data

US 2002/0196083 A1 Dec. 26, 2002

(30) Foreign Application Priority Data

Dec. 30, 1999 (FI) .................. 19992827

(51) Int. Cl.
*H03F 1/00* (2006.01)
*H03F 1/30* (2006.01)
*H03F 1/36* (2006.01)

(52) U.S. Cl. ............... 330/151; 330/290; 330/107

(58) Field of Classification Search ........... 330/151, 330/149, 290, 107
See application file for complete search history.

(56) References Cited

U.S. PATENT DOCUMENTS

| 5,455,538 | A | * | 10/1995 | Kobayashi et al. | ......... 330/149 |
| 5,594,385 | A | | 1/1997 | Anvari | |
| 5,610,554 | A | | 3/1997 | Anvari | |
| 5,973,564 | A | | 10/1999 | Ivanov | |
| 6,069,530 | A | * | 5/2000 | Clark | ......... 330/149 |
| 6,107,880 | A | | 8/2000 | Shaw | |
| 6,111,464 | A | | 8/2000 | Laureanti | |
| 6,545,536 | B1 | * | 4/2003 | Haczewski et al. | ......... 330/149 |
| 6,784,744 | B1 | * | 8/2004 | Tichauer | ......... 330/285 |
| 6,819,176 | B1 | * | 11/2004 | Lee | ......... 330/151 |
| 2002/0101285 | A1 | * | 8/2002 | Chalwin | ......... 330/254 |

FOREIGN PATENT DOCUMENTS

| EP | 860 940 | 8/1998 |
| WO | WO 94/23491 | 10/1994 |
| WO | WO 97/15112 | 4/1997 |
| WO | WO 99/27645 | 6/1999 |

* cited by examiner

*Primary Examiner*—Patricia Nguyen
(74) *Attorney, Agent, or Firm*—Pillsbury Winthrop Shaw Pittman LLP

(57) ABSTRACT

The invention concerns a method for maintaining an optimal operating point of an LDMOS device stable, said LDMOS device producing an output signal including an error signal component. The method comprises separating said error signal component from the output signal of said LDMOS device and using said error signal component for controlling the gate-to-source bias voltage, or Vgs, of said LDMOS device to maintain the optimal operating point of the LDMOS device stable.

9 Claims, 4 Drawing Sheets

CONTROL OF BIAS VOLTAGE

This is the U.S. National Stage of International Application No. PCT/FI00/01133, which was filed on Dec. 21, 2000 in the English language and designated the U.S.

FIELD OF THE INVENTION

The invention relates to a method and an arrangement for maintaining an optimal operating point of LDMOS semiconductor devices stable. The invention is especially useful in a feedforward amplifier arrangement.

BACKGROUND OF THE INVENTION

Particularly in broadband amplifiers and in power amplifiers, amplifier non-linearities cause distortion to an output signal. FIG. 1 illustrates the formation of intermodulation products (IM-products) causing distortion to an output signal. An undistorted input signal 12 consisting of two frequency components $\omega 1$ and $\omega 2$ is fed into an amplifier 14. At the output of the amplifier 14 appears a distorted signal 16, which includes desired signal components at frequencies $\omega 1$ and $\omega 2$ and also two strong undesired signal components close to the desired signal components at the frequencies $2*\omega 1-\omega 2$ and $2*\omega 2-\omega 1$. These undesired signals may appear in the desired signal band, and thereby corrupt the output signal.

LDMOS (Laterally Diffused Metal Oxide Semiconductor) devices are relatively new semiconductor devices, which have improved characteristics compared to conventional semiconductor devices. For example, they have improved IM performance, i.e. they produce less IM-products at the same input power than the conventional semiconductor devices. Typical input power/IM-products curves of a conventional semiconductor device and of an LDMOS device are illustrated in FIG. 2 by a dashed line and a solid line, respectively. In a conventional semiconductor device, the amount of IM-products increases as the input power increases. The advantage of an LDMOS device is that it has an optimal operating point called "sweet point" producing an optimal input power/IM-products ratio.

The characteristics of LDMOS devices make them especially well suited for power amplification. However, they are not widely used at the moment. A reason for this is a considerable drift in gate-source bias voltage, or Vgs. The Vgs is a DC voltage which is used to provide a certain drain-source quiescent current, or Idq. The location of the "sweet point" on the input power axis in FIG. 2 is dependent on this quiescent current. Therefore, the Vgs can be used to set the "sweet point", i.e. optimal operating point, to the preferred input power level. However, if the Vgs is kept constant, the Idq decreases in the course of time because of aging of the LDMOS transistors. In other words, the Vgs corresponding to a certain Idq changes in the course of time. This kind of drift in bias voltage due to transistor aging also appears in "normal" semi-conductor devices, but it is a considerable problem with LDMOS transistors, in particular. Therefore, a method of keeping the Idq constant is needed for LDMOS devices in order to maintain their "sweet point" at the desired signal level. This object can be achieved by reducing the Vgs drift or by adjusting the Vgs for keeping the Idq constant.

One possible method of reducing the Vgs drift is to "burn in" LDMOS devices before they are used, because the drift phenomenon is most considerable at the beginning of the use of an LDMOS device. The disadvantage of this procedure is that it reduces the lifetime of the device. Additionally, "burn in" is difficult and expensive to implement.

Since the Vgs drift has been reduced from more than 25% to 5% for 900 MHz parts and to 12–15% for 2 GHz parts by device manufacturers, the problem of the drift has diminished. However, the problem has not disappeared, because a 10% drift may produce 5–10 dB IM-products, which is still relatively much in a linear amplifier.

One proposed method of adjusting the Vgs to keep the Idq constant is to measure the Idq and make Vgs adjustments on the basis of the measured Idq. The problem in this kind of an arrangement is that the amplifier has to be shut down during the measurement. Additionally, the transistor characteristics that vary from one transistor to another have an effect on the measurement results.

DISCLOSURE OF THE INVENTION

An object of the present invention is to overcome or alleviate the above described problems by providing a method and an arrangement for keeping the Idq constant in an LDMOS device.

The object is achieved by a method and an arrangement which are characterized by what is disclosed in the attached independent claims. Preferred embodiments of the invention are disclosed in the attached dependent claims. In the present invention the bias voltage Vgs of an LDMOS device is adjusted to keep the Idq of the device constant and consequently to maintain an optimal operating point, i.e. the "sweet point", of the device stable. The invention employs a method known from a feedforward amplifier arrangement. A feedforward amplifier arrangement is one possible solution to achieve high power amplification, high efficiency and low distortion. In a feedforward amplifier arrangement, distortion in the output signal of the arrangement is reduced by separating an error signal component from the output signal of the amplifier and then subtracting this error signal component from the output signal of the amplifier containing the error signal component. Thus, the error signal components cancel each other out and the resulting output signal contains considerably less distortion than the original output signal of the amplifier.

According to the invention, this kind of separate error signal component is used for controlling the Vgs of an LDMOS device to maintain the optimal operating point of the LDMOS device stable. The absolute value of the error signal component at the output of the LDMOS device is defined and the Vgs is adjusted in response to this error signal component so that the error signal component at the output of the LDMOS device reaches its minimum.

This invention provides a simple way to control the operating point of LDMOS devices. The invention suits especially well for a feedforward amplifier arrangement, since it employs an error signal that is already generated in a feedforward arrangement and therefore, only few extra components are needed. An advantage of a preferred embodiment of the invention is also that the amplifier does not need to be completely shut down during the Vgs adjustment.

BRIEF DESCRIPTION OF THE DRAWINGS

In the following, the invention will be described in greater detail by means of preferred embodiments with reference to the accompanying drawings, in which.

DETAILED DESCRIPTION OF THE INVENTION

Figure 1:
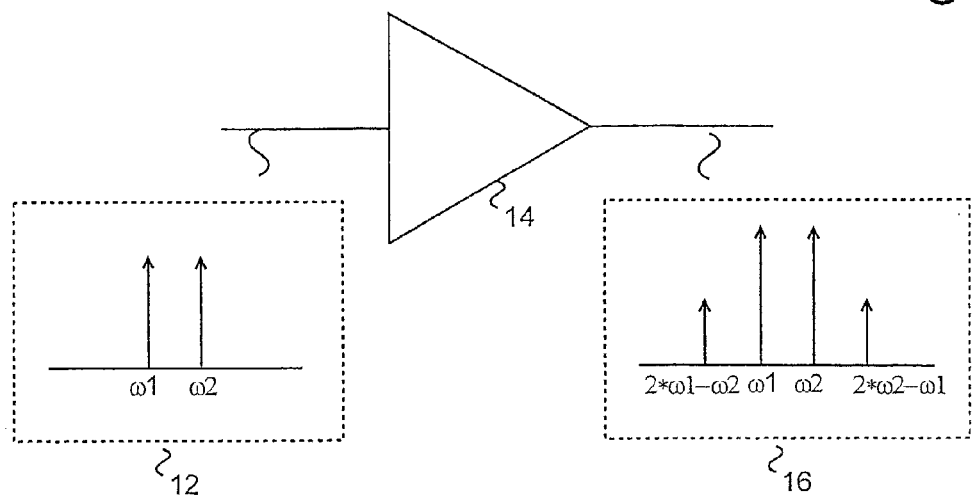
FIG. 1 illustrates formation of IM-products.
Figure 2:
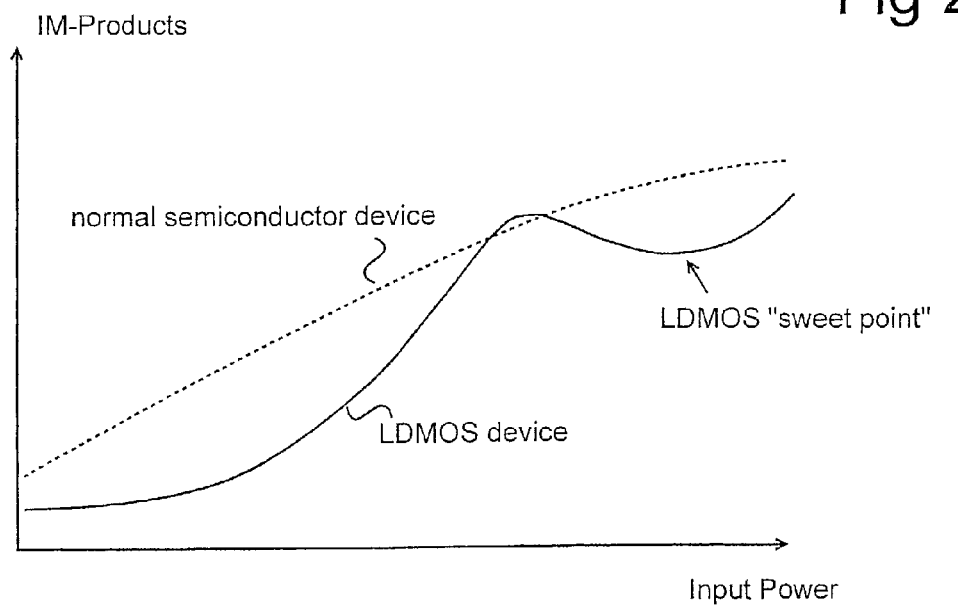
FIG. 2 illustrates typical input power/IM-products curves of a conventional semiconductor device and of an LDMOS device.

The present invention can be applied to bias voltage control of an LDMOS device. In the following, the preferred embodiments of the invention will be described by means of a feedforward arrangement, but the invention is not limited to a feedforward arrangement. The same reference numerals are used for equivalent components in the figures.

Figure 3A:
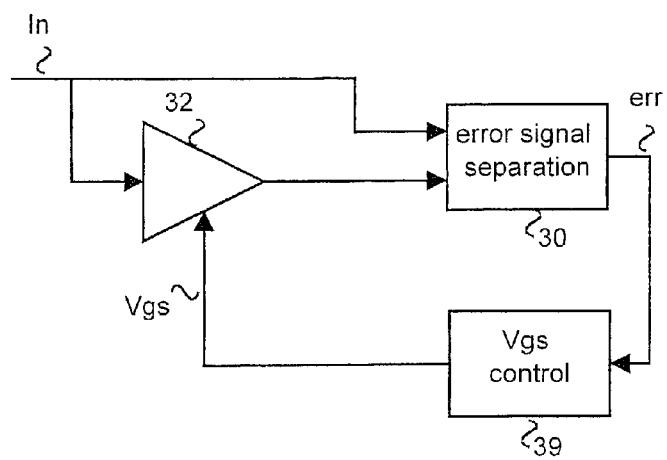
FIG. 3A is a block diagram illustrating an arrangement according to the invention.

FIG. 3A illustrates a block diagram of an arrangement according to the invention including an LDMOS device 32, error signal separating means 30 and Vgs control means 39. The LDMOS device 32 receives an input signal In and produces, on the basis of this input signal In, an output signal including distortion. This output signal of the LDMOS device is connected to the error signal separating means 30 together with the input signal In. The error signal separating means 30 produce an error signal component err which is connected to the Vgs control means 39. On the basis of the error signal component err, the Vgs control means adjust the Vgs of the LDMOS device 32 to keep the operating point of the LDMOS device 32 stable.

Figure 3B:
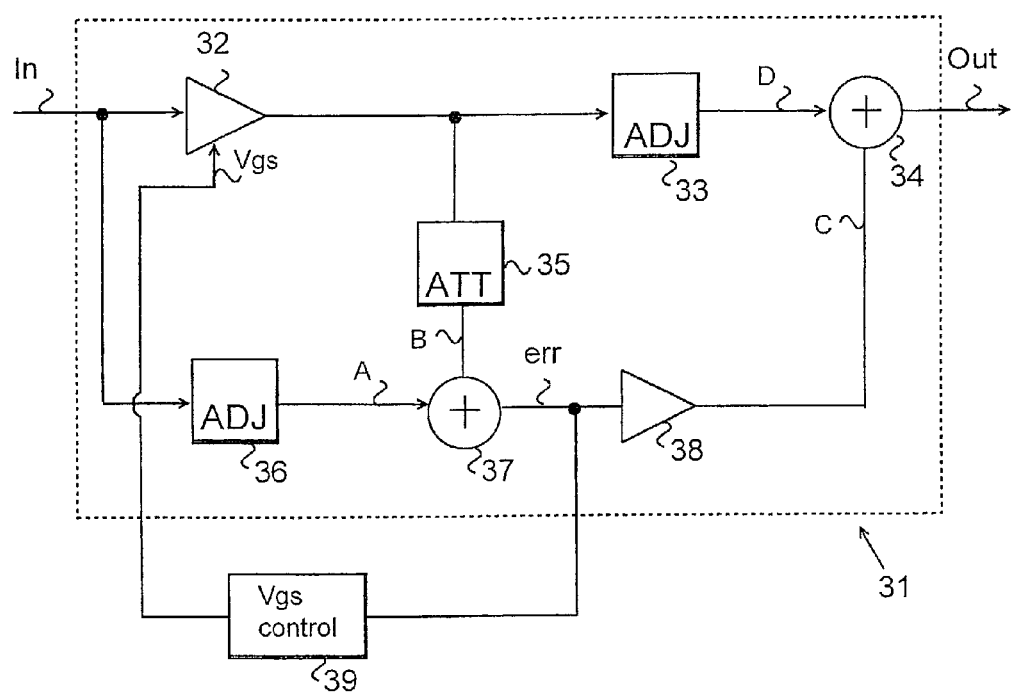
FIG. 3B is a block diagram illustrating an embodiment according to the invention.

FIG. 3B illustrates an embodiment of the invention including a basic feedforward arrangement 31 and Vgs control means 39. The feedforward arrangement includes an LDMOS amplifier 32, attenuation means 35, time (delay) adjusting means 33 and 36, adders 34 and 37 and an error signal amplifier 38. An input signal In is connected to an input of the LDMOS amplifier 32. For obtaining an error signal component err, the input signal is adjusted in time (delayed) with time adjusting means 36 for producing signal A and the output signal of the LDMOS amplifier 32 is attenuated with attenuation means 35 for obtaining signal B. In this way, signals A and B, which are fed into the adder 37, have equal amplitudes and a 180° phase difference relative to each other, and the error signal component err is obtained as an output of the adder 37. For obtaining an output signal Out, in which the error signal component is canceled, the error signal component err is amplified by the error signal amplifier 38 for obtaining signal C and the output signal of the LDMOS amplifier 32 is adjusted in time (delayed) with time adjusting means 33 for obtaining signal D. In this way, signals C and D, which are fed into the adder 34, have equal amplitudes and a 180° phase difference relative to each other, and the output signal Out, in which the error signal component is canceled, is obtained as an output of the adder 34.

According to the embodiment shown in FIG. 3, the error signal component err is also connected to the Vgs control means 39. The Vgs control means produce the Vgs for the LDMOS amplifier 32 on the basis of the error signal component err, as will be described later in connection with FIG. 5.

Figure 4:
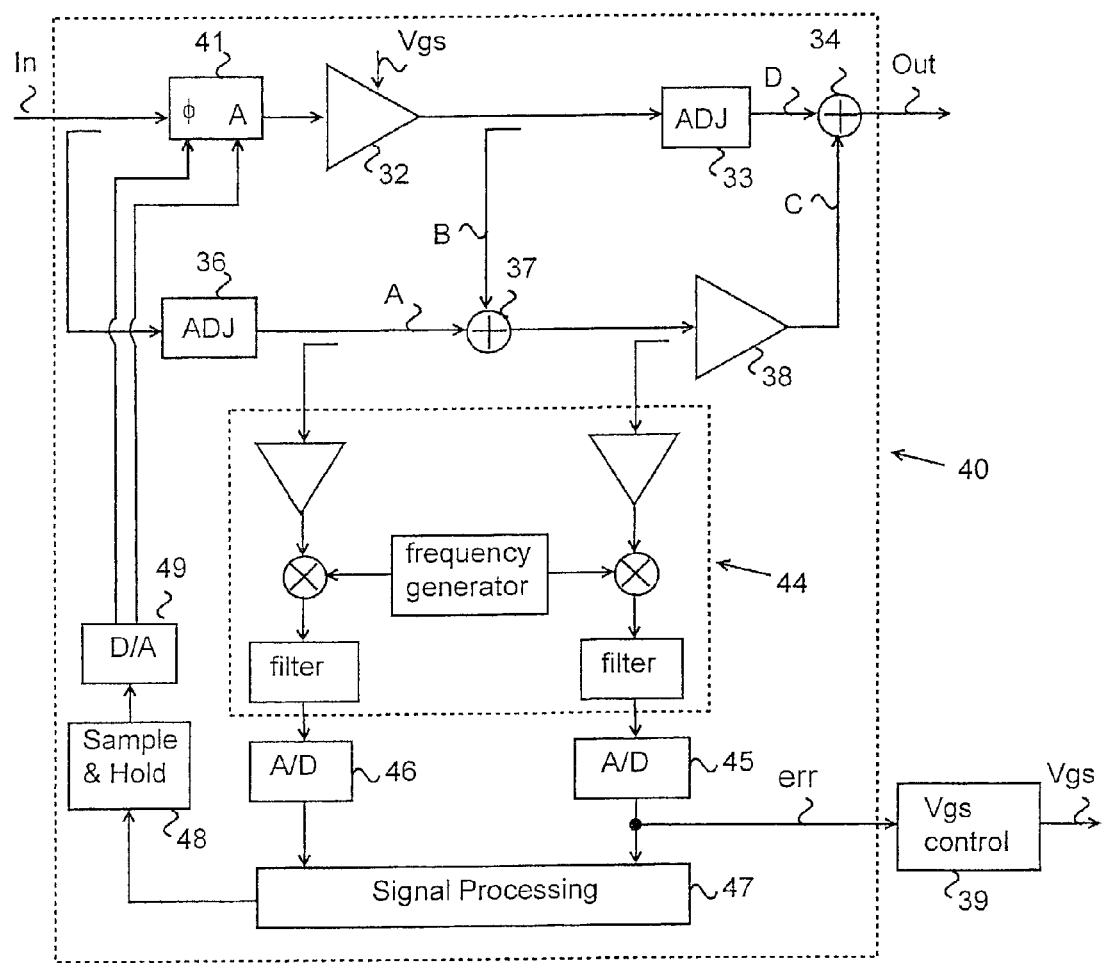
FIG. 4 is a block diagram illustrating another embodiment according to the invention.

FIG. 4 illustrates another embodiment of the invention including a feedforward arrangement 40 and Vgs control means 39. The feedforward arrangement 40 includes an LDMOS amplifier 32, adders 34 and 37, time (delay) adjusting means 33 and 36 and an error signal amplifier 38, all of which operate essentially in the same way as in the arrangement of FIG. 3B. Gain/phase adjustment means 41 are added for adjusting the phase φ and gain A of the input signal In before amplification. Additionally, the arrangement 40 includes down converter means 44 for converting the error signal and the input signal to a lower frequency, and A/D converters 45 and 46 for converting respective down-converted signals to a digital form for digital signal processing. In response to the output signals of the A/D converters 45 and 46, signal processing means 47 produce a control signal which is connected to adjustment means 41 via sample & hold means 48 and a D/A converter 49.

The error signal component err obtained as an output of the A/D converter 45 is also connected to the Vgs control means 39. The Vgs control means produce the Vgs for the LDMOS amplifier 32 on the basis of the error signal component err. The error signal component err is handled in digital domain by the Vgs control means, and the Vgs is produced in a digital form and then converted to an analog form by the Vgs control means.

The operation of the adjustment means in FIGS. 3B and 4 must not be changed during the Vgs adjustment, but otherwise the LDMOS amplifier 32 can be operated normally. In other words, the LDMOS amplifier does not have to be completely shut down during the Vgs adjustment.

Figure 5:
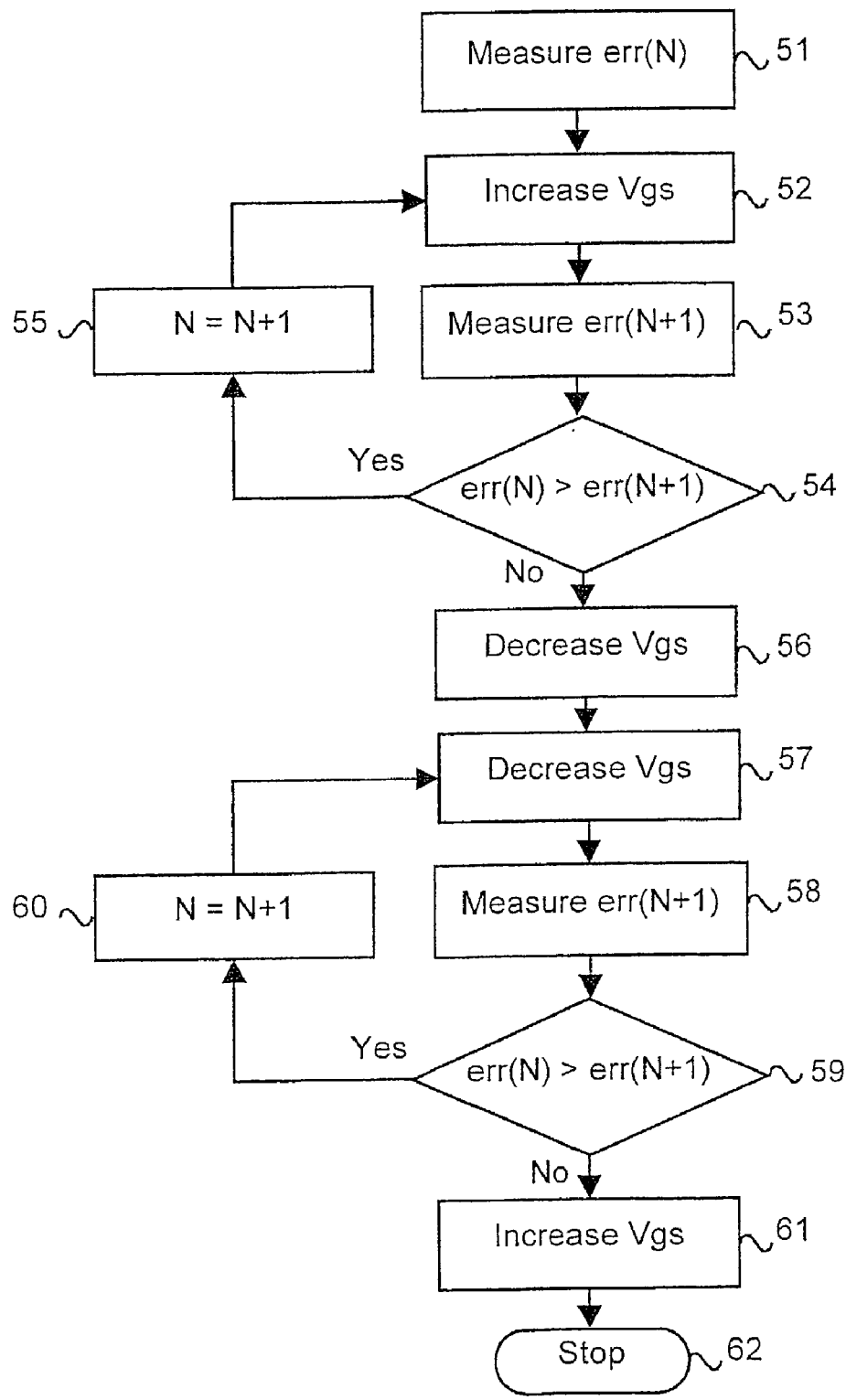
FIG. 5 is a flow chart illustrating the operation of the Vgs control block according to the invention.

FIG. 5 is a flow chart illustrating the operation of a possible implementation of the Vgs control means 39 in FIGS. 3 and 4. This implementation tries several Vgs values, each attempt having an attempt number N. In step 51, the power level of the Nth error signal err(N) is measured. Then Vgs is increased in step 52 and the power level of the (N+1)th error signal err(N+1) is measured in step 53. In step 54, the power levels of Nth and (N+1)th error signal are compared and, if err(N)>err(N+1), N is incremented in step 55 and steps 52 to 54 are repeated. Otherwise, the Vgs is first decreased to the value corresponding the Nth error signal in step 56 and then decreased again in step 57. Next, the power level of the (N+1)th error signal err(N+1) is measured in step 58, and the power levels of Nth and (N+1)th error signal are compared in step 59. If err(N)>err(N+1), N is incremented in step 60, and steps 57 to 59 are repeated. Otherwise, the Vgs is increased to the value corresponding the Nth error signal in step 61, and the operation is terminated in step 62.

The description only illustrates preferred embodiments of the invention. The invention is not, however, limited to these examples, but it may vary within the scope of the appended claims.

The invention claimed is:

1. A method for maintaining an optimal operating point of an Laterally Diffused Metal Oxide Semiconductor (LDMOS) device stable, the method comprising
producing from said LDMOS device an output signal including an error signal component,
separating said error signal component from the output signal of said LDMOS device,
using said error signal component in controlling the gate-to-source bias voltage Vgs of said LDMOS device to maintain the optimal operating point of said LDMOS device stable, and
using said method in a feedforward amplifier arrangement.

2. A method according to claim 1, wherein controlling said Vgs comprises setting different values to said Vgs until the error signal component reaches its minimum.

3. A method according to claim 1 or 2, comprising controlling the bias voltage without shutting the LDMOS device completely down.

4. An arrangement for maintaining an optimal operating point of an Laterally Diffused Metal Oxide Semiconductor (LDMOS) device stable, said arrangement comprising
- said LDMOS device configured to receive an input signal and produce an output signal based on the input signal, the output signal including an error signal component,
- error signal separator separating an error signal component from said output signal,
- gate-to-source bias voltage controller receiving said error signal component as an input and adjusting a gate-to-source bias voltage Vgs responsive to said error signal component and providing the gate-to-source bias voltage Vgs to said LDMOS device to maintain the optimal operating point of said LDMOS device stable,
- wherein the arrangement is located in a feedforward amplifier arrangement.

5. An arrangement according to claim 4, wherein gate-to-source bias voltage controller is configured to operate without shutting the LDMOS device completely down.

6. An arrangement according to claim 4 or 5, wherein the arrangement is part of a multicarrier amplifier.

7. An electronic device, comprising
- an Laterally Diffused Metal Oxide Semiconductor (LDMOS) device configured to receive an input signal and produce an output signal based on the input signal, the output signal including an error signal component,
- error signal separator separating an error signal component from said output signal,
- gate-to-source bias voltage controller receiving said error signal component as an input and adjusting a gate-to-source bias voltage Vgs responsive to said error signal component and providing the gate-to-source bias voltage Vgs to said LDMOS device to maintain the optimal operating point of said LDMOS device stable,
- wherein the electronic device is a feedforward amplifier.

8. An electronic device according to claim 7, wherein gate-to-source bias voltage controller is configured to operate without shutting the LDMOS device completely down.

9. An electronic device according to claim 7 or 8, wherein the amplifier is a multicarrier amplifier.

* * * * *